(12) United States Patent
Usher et al.

(10) Patent No.: US 9,270,244 B2
(45) Date of Patent: *Feb. 23, 2016

(54) SYSTEM AND METHOD TO DETECT CLOSE VOICE SOURCES AND AUTOMATICALLY ENHANCE SITUATION AWARENESS

(71) Applicants: John Usher, Beer (GB); Steven W. Goldstein, Delray Beach, FL (US)

(72) Inventors: John Usher, Beer (GB); Steven W. Goldstein, Delray Beach, FL (US)

(73) Assignee: Personics Holdings, LLC, Boca Raton, FL (US)

( * ) Notice: Subject to any disclaimer, the term of this patent is extended or adjusted under 35 U.S.C. 154(b) by 69 days.

This patent is subject to a terminal disclaimer.

(21) Appl. No.: 14/210,430

(22) Filed: Mar. 13, 2014

(65) Prior Publication Data

US 2014/0270200 A1 Sep. 18, 2014

Related U.S. Application Data

(60) Provisional application No. 61/778,737, filed on Mar. 13, 2013.

(51) Int. Cl.
| | |
|---|---|
| *G10L 21/0272* | (2013.01) |
| *H03G 3/32* | (2006.01) |
| *H04R 1/10* | (2006.01) |
| *G10L 25/78* | (2013.01) |
| *H04R 1/40* | (2006.01) |
| *H04R 3/00* | (2006.01) |

(52) U.S. Cl.
CPC *H03G 3/32* (2013.01); *G10L 25/78* (2013.01); *H04R 1/1041* (2013.01); *H04R 1/1016* (2013.01); *H04R 1/406* (2013.01); *H04R 3/005* (2013.01); *H04R 2201/107* (2013.01); *H04R 2420/01* (2013.01); *H04R 2420/07* (2013.01)

(58) Field of Classification Search
CPC ............. G10L 21/0272; H04R 1/1041; H04R 1/1016; H04R 1/406
USPC ......... 381/56, 57, 60, 312, 317, 318, 328, 17, 381/74, 107, 309; 704/229; 340/944; 345/7; 379/93.05, 207.02; 434/178; 455/570
See application file for complete search history.

(56) References Cited

U.S. PATENT DOCUMENTS

| | | | | |
|---|---|---|---|---|
| 4,837,832 | A * | 6/1989 | Fanshel | .......................... 381/317 |
| 4,951,045 | A * | 8/1990 | Knapp | ................... G08B 5/006 |
| | | | | 340/525 |

(Continued)

FOREIGN PATENT DOCUMENTS

| | | |
|---|---|---|
| WO | WO2012/078670 A1 | 6/2012 |
| WO | WO2014/022359 A2 | 2/2014 |

*Primary Examiner* — Gerald Gauthier
(74) *Attorney, Agent, or Firm* — Pablo Meles

(57) ABSTRACT

A system and method for enhancing two-way conversation between a user wearing at least one communication system or earphone and a second individual in proximity to the user is provided. The method includes detecting a spoken voice of the user from sounds captured at an ambient sound microphone, automatically activating a voice timer and setting a voice activity threshold for the voice timer responsive to detecting spoken voice, and adjusting a mixing gain of an audio content signal delivered to the earphone or communication system by way of the internal speaker with an ambient sound pass-through during activation of the voice timer. Separate mixing gains can be adjusted independently in accordance with spoken voice activity and reproduced audio content characteristics. Other embodiments are disclosed.

30 Claims, 11 Drawing Sheets

(56) References Cited

U.S. PATENT DOCUMENTS

| | | | |
|---|---|---|---|
| 5,533,105 A * | 7/1996 | Brown | H04M 1/00 379/442 |
| 5,867,581 A * | 2/1999 | Obara | 381/312 |
| 6,023,517 A * | 2/2000 | Ishige | 381/315 |
| 6,415,034 B1 | 7/2002 | Hietanen | |
| 6,644,973 B2 * | 11/2003 | Oster | G09B 19/04 434/156 |
| 6,661,901 B1 * | 12/2003 | Svean et al. | 381/328 |
| 7,532,717 B2 | 5/2009 | Nishimura | |
| 8,059,847 B2 * | 11/2011 | Nordahn | 381/328 |
| 8,098,844 B2 | 1/2012 | Elko | |
| 8,150,044 B2 * | 4/2012 | Goldstein et al. | 381/57 |
| 8,340,303 B2 * | 12/2012 | Chun | H04S 7/30 381/17 |
| 8,391,501 B2 | 3/2013 | Khawand et al. | |
| 8,401,206 B2 | 3/2013 | Seltzer et al. | |
| 8,467,543 B2 | 6/2013 | Burnett et al. | |
| 8,503,704 B2 | 8/2013 | Francart et al. | |
| 8,583,428 B2 | 11/2013 | Tashev et al. | |
| 8,600,454 B2 | 12/2013 | Nicholson | |
| 8,606,571 B1 | 12/2013 | Every et al. | |
| 8,718,305 B2 * | 5/2014 | Usher et al. | 381/318 |
| 2003/0035551 A1 | 2/2003 | Light et al. | |
| 2004/0037428 A1 * | 2/2004 | Keller | 381/60 |
| 2004/0234089 A1 * | 11/2004 | Rembrand et al. | 381/312 |
| 2005/0175189 A1 | 8/2005 | Lee et al. | |
| 2006/0074693 A1 | 4/2006 | Yamashita | |
| 2006/0133621 A1 | 6/2006 | Chen et al. | |
| 2006/0262938 A1 * | 11/2006 | Gauger et al. | 381/56 |
| 2006/0294091 A1 * | 12/2006 | Hsieh | G06F 17/30017 |
| 2007/0030211 A1 * | 2/2007 | McGlone | B63B 43/00 345/7 |
| 2007/0053522 A1 | 3/2007 | Murray et al. | |
| 2007/0076896 A1 | 4/2007 | Hosaka et al. | |
| 2007/0076898 A1 | 4/2007 | Sarroukh et al. | |
| 2007/0088544 A1 | 4/2007 | Acero et al. | |
| 2007/0160243 A1 * | 7/2007 | Dijkstra et al. | 381/317 |
| 2007/0230712 A1 | 10/2007 | Belt et al. | |
| 2008/0137873 A1 * | 6/2008 | Goldstein | H04R 1/1016 381/57 |
| 2008/0147397 A1 | 6/2008 | Konig et al. | |
| 2008/0181419 A1 * | 7/2008 | Goldstein | H04R 3/002 381/57 |
| 2008/0253583 A1 * | 10/2008 | Goldstein | H04R 1/1091 381/92 |
| 2008/0260180 A1 * | 10/2008 | Goldstein | H04R 25/50 381/110 |
| 2009/0010442 A1 | 1/2009 | Usher et al. | |
| 2009/0010444 A1 * | 1/2009 | Goldstein | H04R 3/00 381/66 |
| 2009/0010456 A1 * | 1/2009 | Goldstein | H04R 25/02 381/110 |
| 2009/0016542 A1 | 1/2009 | Goldstein et al. | |
| 2009/0209290 A1 | 8/2009 | Chen et al. | |
| 2009/0220096 A1 | 9/2009 | Usher et al. | |
| 2009/0264161 A1 * | 10/2009 | Usher | H04M 1/22 455/570 |
| 2010/0074451 A1 * | 3/2010 | Usher | H04R 25/70 381/58 |
| 2010/0104119 A1 * | 4/2010 | Lan | H04R 5/04 381/309 |
| 2011/0206217 A1 * | 8/2011 | Weis | H04M 1/6066 381/74 |
| 2014/0119553 A1 * | 5/2014 | Usher | H04R 1/1083 381/72 |
| 2014/0119571 A1 * | 5/2014 | Jiang | H04M 1/6016 381/107 |
| 2014/0172422 A1 * | 6/2014 | Hefetz | 704/229 |
| 2014/0270200 A1 * | 9/2014 | Usher et al. | 381/57 |
| 2014/0314238 A1 * | 10/2014 | Usher | H04R 3/04 381/17 |
| 2015/0036832 A1 * | 2/2015 | Usher | H04R 3/005 381/56 |
| 2015/0131814 A1 * | 5/2015 | Usher | G06F 3/017 381/123 |
| 2015/0172814 A1 * | 6/2015 | Usher | H04R 3/005 381/92 |
| 2015/0179178 A1 * | 6/2015 | Usher | G10L 21/038 704/500 |
| 2015/0215701 A1 * | 7/2015 | Usher | H04R 1/1041 381/71.6 |

* cited by examiner

280

135

140

400

500

SYSTEM AND METHOD TO DETECT CLOSE VOICE SOURCES AND AUTOMATICALLY ENHANCE SITUATION AWARENESS

CROSS-REFERENCE

This Application is a utility patent application that claims the priority benefit of U.S. Provisional Patent Application No. 61/778,737 filed on Mar. 13, 2013, the entire disclosure and content of which is incorporated herein by reference in its entirety.

FIELD

The present examples relate to processing audio and acoustic signals, and particularly to an earphone or earphones, ear-coupling devices, and mobile devices for enhancing voice communication and situation awareness in a user environment.

BACKGROUND

Earphones are increasingly used by professionals and consumers for voice communications and music listening. The benefits for voice communications and music listener are to enhance audio signal integrity, increase intelligibility of voice communication, voice messages and improve music quality. One disadvantage of earphones is that the user is sonically impaired from their environment. If the user, while listening to music, wishes to interact with people in their immediate physical environment, they are generally required to manually stop playback of audio content on the mobile device and remove the earphone(s). Such a manual action may be difficult to do in a timely manner, resulting in missed sound or conversational information.

A need thus exists to enhance awareness of audible sounds in the environment with respect to the sonically impaired user.

DETAILED DESCRIPTION

Figure 1A:
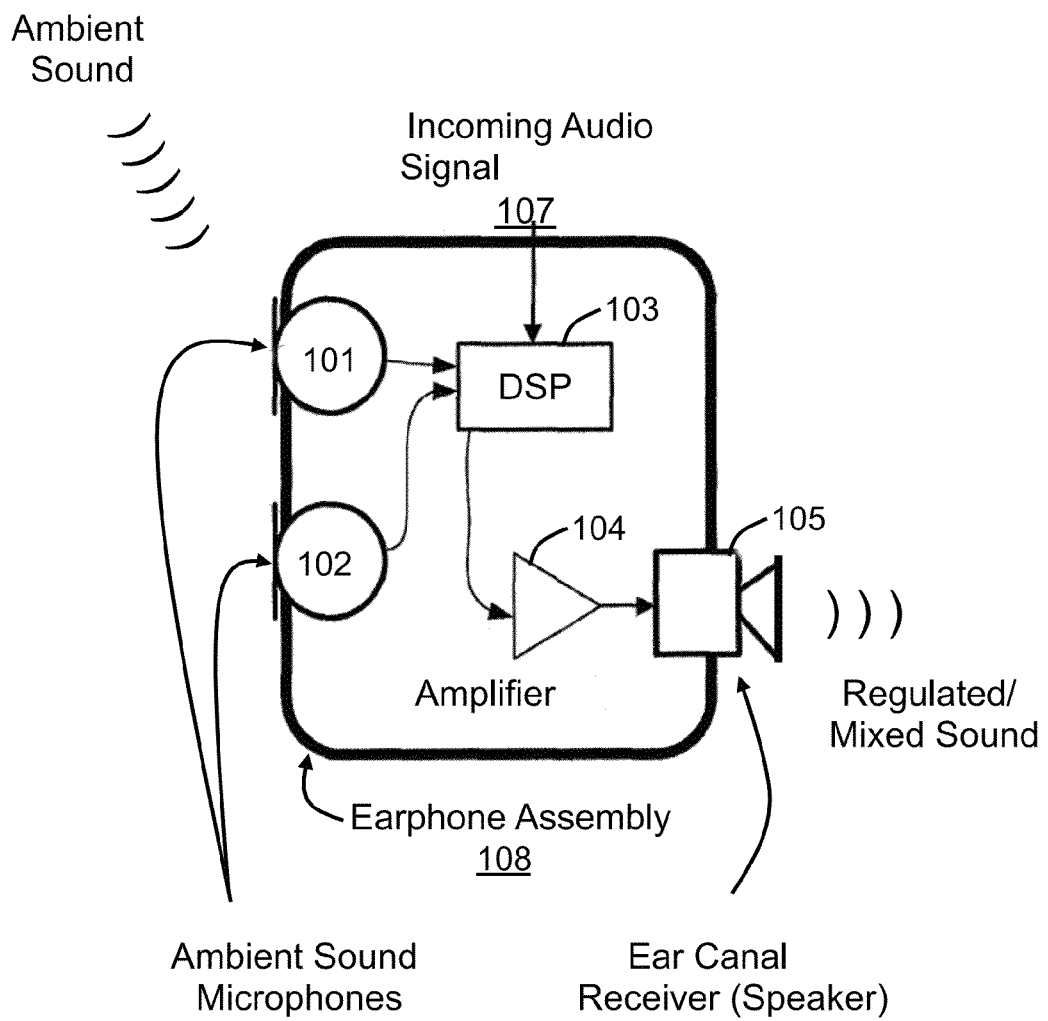
FIG. 1A illustrates an earphone assembly that can provide sound isolation and configured by way of electronic components for enhancing situation awareness in accordance with an exemplary embodiment.

The following description of at least one exemplary embodiment is merely illustrative in nature and is in no way intended to limit the embodiments herein, its application, or uses. Similar reference numerals and letters refer to similar items in the following figures, and thus once an item is defined in one figure, it may not be discussed for following figures.

Herein provided is a method and system for automatically detecting when an earphone user and a second nearby user are engaged in a voice conversation, and activating a sound pass-through system such that the nearby voice source is automatically heard by the user of the sound isolating earphone.

FIG. 1A illustrates an earphone 100 that can provide sound isolation and is configured by way of electronic components to detect close voice sources and enhance situation awareness in accordance with an exemplary embodiment. The earphone 100 can be a self-contained device or can be integrated with one or more other devices or cooperatively operate with one or more devices. Note, in some embodiments, the earphone assembly 108 is not sound isolating or can be partially sound isolating. In some embodiments, the earphone assembly 108 can occlude a user's ear canal and in other embodiments the earphone assembly 108 can partially occlude a user's ear canal or not occlude a user's ear at all. The earphone 100 can include an earphone assembly 108 and in some embodiments the earphone assembly 108 is a sound isolating earphone assembly of the earphone 100 that can audibly isolate ambient sounds external to the user's ear canal. In some embodiments, it can comfortably fit within the ear and regulate the flow of audible sounds from the environment through the ear canal, which includes voice signals from individuals in close proximity to the wearer of the earpiece ("the user"). In some embodiments, the earphone assembly can fit outside the ear, but yet provide sound isolation or partially provide sound isolation. In yet some other embodiments, the earphone 100 or earphone assembly 108 may not provide any sound isolation. Aspects of the earphone assembly 108 as a sound isolation component are discussed ahead in FIG. 4 and also in U.S. patent application Ser. No. 12/785,682 filed May 24, 2010, entitled "METHOD AND DEVICE FOR ACOUSTIC SEALING AND OCCLUSION EFFECT MITIGATION" commonly assigned and the entire contents of which are hereby incorporated by reference in entirety.

For such purpose, the earphone 100 includes a processor 103 (e.g., Digital Signal Processor—DSP) operatively coupled to one or more ambient sound microphones (101/102), an amplifier 104 and an ear canal receiver 105. A further illustration of the earphone 100 in some embodiments include other components that provide additional features for sound isolation, ambient sound pass-through, audio mixing and audio content reproduction and filtering is shown and described in greater detail in FIG. 5. Audio content can include a voice signal, music content, or audible sound delivered from a mobile device to the internal speaker 105 for audible reproduction. In some embodiments, aspects of the earphone assembly 108 as a sound isolation component are discussed ahead with respect to FIG. 4 and also in U.S. patent application Ser. No. 12/323,505, filed Nov. 26, 2008 entitled "METHOD AND DEVICE TO MAINTAIN AUDIO CONTENT LEVEL REPRODUCTION" commonly assigned and the entire contents of which are hereby incorporated by reference in entirety.

The earphone 100 may be worn by "the user" for enhancing situation awareness, which can include aspects of audibly blocking environmental sounds, and/or, in conjunction with, audio content delivery where the earphone is used for voice communication and/or music listening. The two ambient sound microphone (101/102) signals are directed to the processor 103 which can reside on the earphone 100 or a mobile device as shown and described ahead. The processor 103 can also receive an incoming audio signal 107, e.g. a voice or music signal from a mobile device. Based on an analysis of the at least two ambient microphone (101/102) signals, at least one of the ambient microphone signals is mixed with the incoming audio signal 107 and directed to the ear canal receiver (ECR) 105 (i.e., a loudspeaker in the sound isolating earphone that audibly delivers the audible signal to the user's eardrum). The audio signal can be adjusted by way of the amplifier 104 to increase its signal to noise ratio prior to play out on ECR 105. In some embodiments, the at least two ambient microphone signals are from ambient microphones (101/102) in the same earphone 100, and in some other embodiments one ambient microphone 101 is in a first earphone and the second ambient microphone 102 is in a second earphone (i.e., the second earphone is worn in the other ear of the earphone user). In yet some other embodiments as further discussed with respect to FIG. 2A, the ambient microphone or microphones are not limited to earphones in a headset or earpiece, but can include or work cooperatively with microphones such as ambient microphones in a separate device such as a mobile device or watch for example.

Figure 1B:
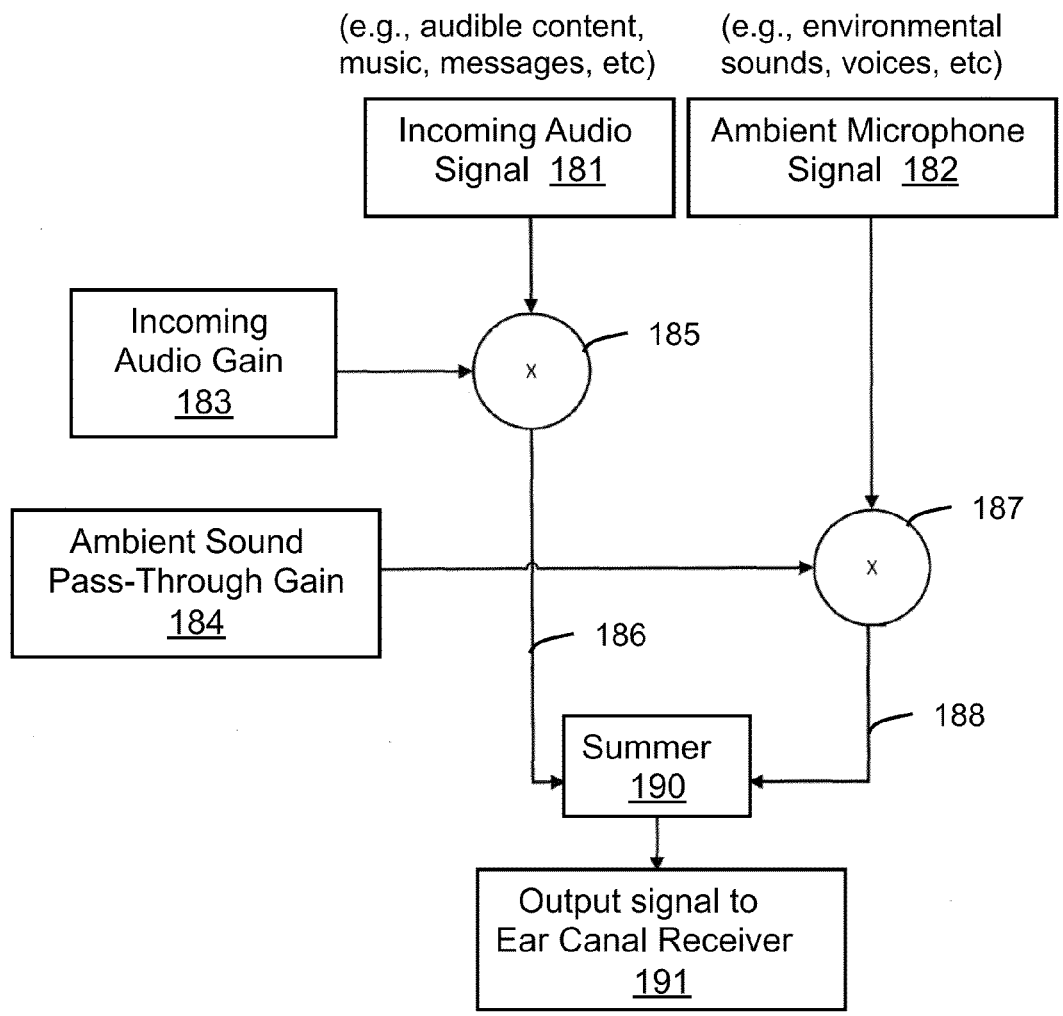
FIG. 1B illustrates a flowchart of a method for enhancing situation awareness of the earphone in FIG. 1A by way of mixing ambient sound signals and audible content n accordance with an exemplary embodiment.

FIG. 1B illustrates a flowchart of a method 180 for enhancing situation awareness suitable for use with the earphone in FIG. 1A by way of mixing audible content 181 and ambient sound signals 182 in accordance with an exemplary embodiment. The method 180 may be practiced with more or less than the number of steps shown. When describing the method 180, reference will be made to FIG. 1A for identifying exemplary components that can implement the method steps herein. Moreover, the method 150 can be practiced by the components presented in the figures herein though is not limited to the components shown and can be implemented with either more or less than the components shown.

The method 180 can begin in a state where a user is wearing the earphone 100 and listening to audio content 181 (AC) and in an environment filled with ambient sounds 182. As an example, the audio content 181 may be music or other media delivered to the earphone 100 by way of a communicatively coupled mobile device or other media source. The ambient sounds 182 may be environmental sounds or other sounds in proximity to the user (e.g., traffic, noise, silence, other people talking, etc.). The processor 103 through analysis of the ambient sounds 182 captured by the ASM microphone(s) (101/102) and the audio content 181 can automatically adjust the gains of these signals and mix them together to produce a combined audio signal 191 that is delivered to the ear canal.

As illustrated, the incoming audio signal 181 is adjusted by way of the first stage 185 with the incoming audio gain 183 to produce the modified audio signal 186. The incoming audio gain 183 regulates the level of the audio content (AC) that is delivered to the ear canal. The ambient microphone signal 182 is also adjusted separately by way of the second stage 187 with the ambient sound pass-through gain 183 to produce the modified ambient signal 188. The ambient sound gain 183 regulates how much of the ambient sound from the external environment is passed on to the user's ear canal. The two gain coefficients for the AC 181 and ASM 182 signals and are generated according to a "Close Voice Activity Detection" system described ahead. In some embodiments, the gains may be frequency dependent. The modified audio signal 186 and the modified ambient signal 188 are combined at the summer 190 and delivered as an output signal 191 to the ear canal receiver.

Figure 2A:
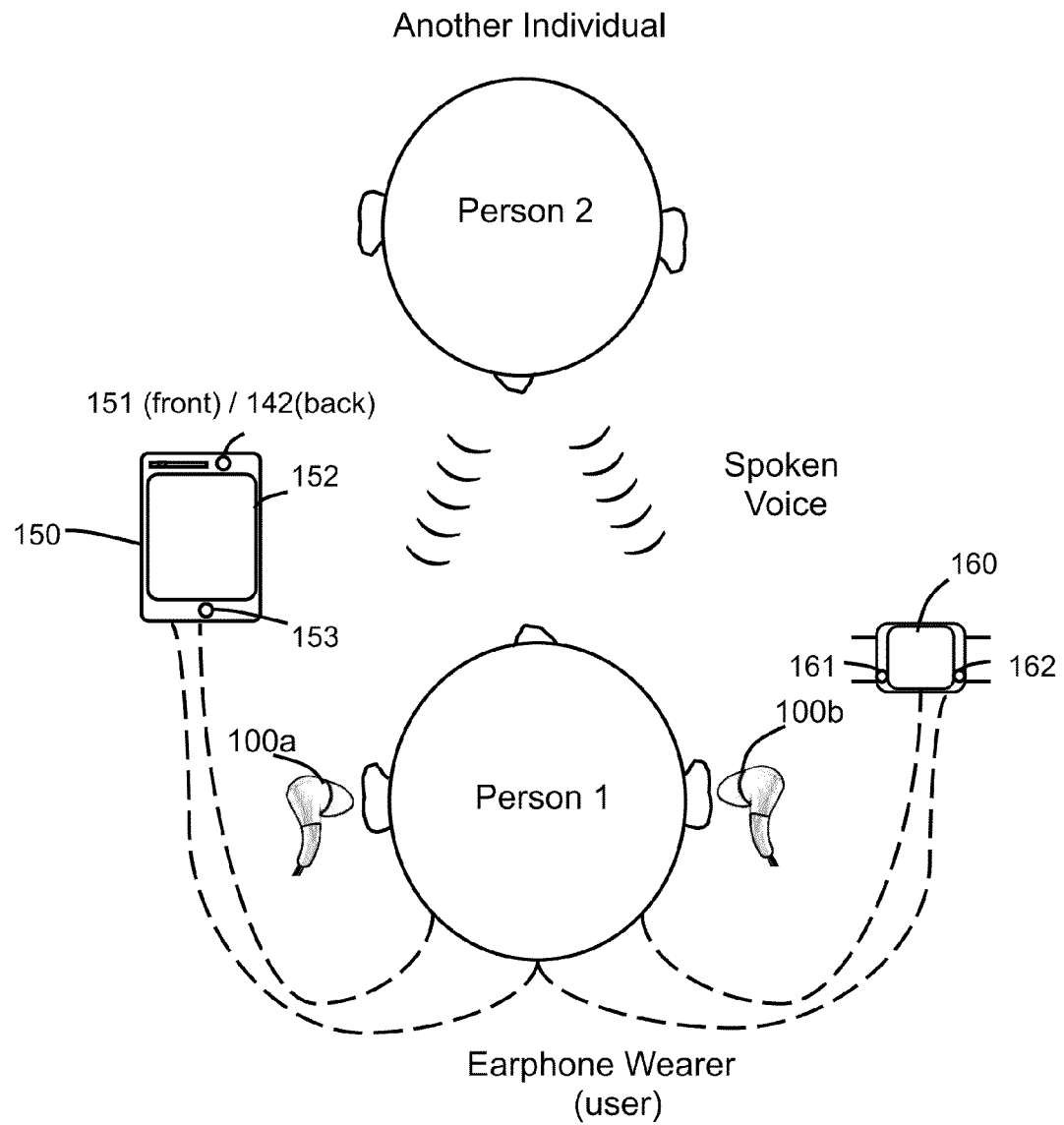
FIG. 2A depicts a user context for situation awareness to enable hands-free operation for controlling an ambient sound pass-through in voice conversation with a second individual in close proximity and in front of a wearer of the earphone in accordance with the exemplary embodiments.

The earphone 100 monitors the levels/frequency of the audio content which the user is listening and also the levels/frequency of the ambient sounds in the user's environment. Accordingly, each gain stage gain (e.g., first stage 185, second stage 187) can be adjusted dependent of frequency, or automatically adjusted. For example, the processor 103 can selectively filter (amplify/attenuate) audio content 181 and ambient sound 182 frequencies depending on similarity, context and/or rating. Each gain stage is generated/adjusted according to a "close voice activity detection"; that is, the gains 183/184 are individually adjusted depending on user/environment context for enhancing situation awareness, for instance, when a second person is talking in close proximity and directing conversation to the user. That is, with "close voice activity detection" enabled, the user wearing the earphone 100 and listening to audio content is made aware that a person is speaking to them. FIG. 2A depicts such a user context for situation awareness to enable hands-free operation for controlling ambient sound pass-through in voice conversation with a second individual in close proximity and in front of a wearer of the earphone in accordance with an exemplary embodiment.

As depicted in FIG. 2A, Person 1 is a user wearing earphone(s) 100a/100b and Person 2 is another individual in close proximity that is speaking to Person 1. Individually, or together, the earphones 100a/100b are enabled for "close voice activity detection" such that the user does not have to manually control the level of reproduced audio or level of ambient sound reproduced in the occluded or partially occluded ear-canal; that is, it is a "hands-free" operation. Although the earphones are shown paired and with similar corresponding operation, there are embodiments wherein one of the earphones practicing method 180 is configured differently such that one earphone with respect to the other operates differently from the other, for example, based on which one is closer to the secondary sound source (Person 2). In such case, the closer of the two earphones 100a/100b can amplify sounds greater or less than the other to audibly convey or emphasize the location of Person 2. In another arrangement, the other earphones 100a/100b can audibly compensate the volume levels there between to spatialize the secondary sound source, for example, in front of the user (Person 1), even though the talker (Person 2) is to one side. This is an arrangement shown and discussed ahead in FIG. 2C.

In some embodiments, as represented by additional devices 150 and 160 in FIG. 2A, the additional devices can include microphones such as ambient microphones that operate cooperatively to provide hands-free operation of the earphones 100a/100b (if used) or provide hands-free operation of the additional devices as desired. For example, a mobile device 150 as a media device (i.e., smartphone, media player, etc.) which can be communicatively coupled to the earphone 100 of FIG. 1 or earphones 100a/100b in FIG. 2A where the a processor (either locally as processor 103 or remotely at a server for example or at another device such as a second media device 160) can serve as an audio controller. The mobile device 150 can include one or more microphones 151 on a front and/or 142 on a back side, a visual display 152 for providing user input, and an interaction element 153. The second media device 160 can be a wristwatch device for example, which also can be communicatively coupled to the one or more devices (100a/100b/150). The device 160 can also include one or more microphones 161/162 singly or in an array, for example, beamforming for localization of a user's voice or for permitting manual capture of a sound source when the wristwatch is manually oriented in a specific direction. Thus, the microphones or any portion thereof in any of the devices 100, 100a, 100b, 150, and 160 can work cooperatively to enhance situational awareness as contemplated by the various embodiments herein.

Figure 2B:
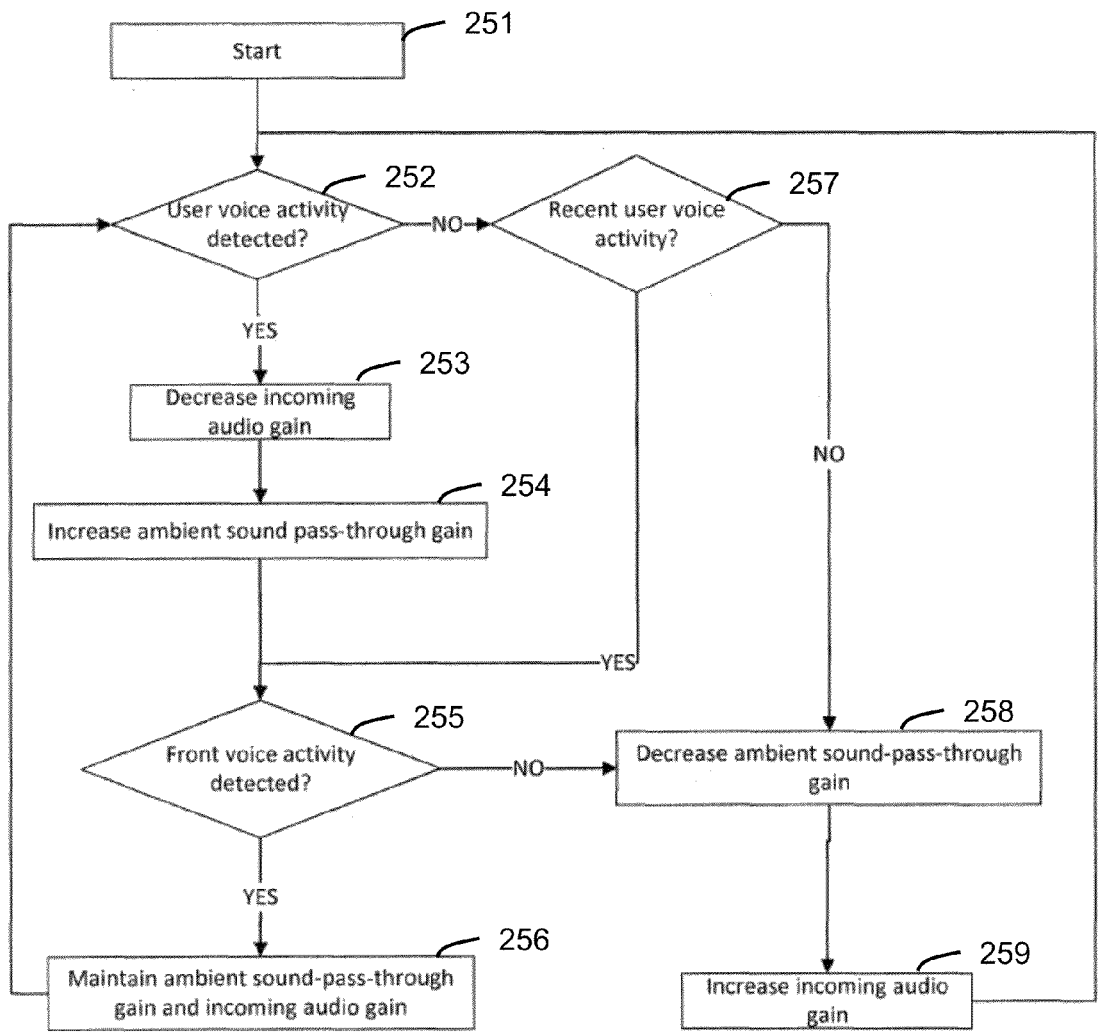
FIG. 2B illustrates a flowchart of a method for controlling an ambient sound pass-through for enhancing situation awareness as depicted in FIG. 2A in accordance with an exemplary embodiment.

FIG. 2B illustrates a flowchart of a method 250 for controlling an ambient sound pass-through to enhance situation awareness in accordance with an exemplary embodiment. The method 250 may be practiced with more or less than the number of steps shown. When describing the method 250, reference will be made to FIGS. 1A, 1B and 2A for identifying exemplary components that can implement the method steps herein. Moreover, the method 250 can be practiced by the components presented in the figures herein though is not limited to the components shown and can be implemented with more or less than the components shown in FIGS. 1A, 1B and 2A. In this embodiment, the method 250 for audio mixing can be performed by the processor 103.

The method 250 can start in a state 251 as depicted in FIG. 2A where the user is listening to music and another individual initiates conversation with, or begins speaking to, the user. At step 252, the processor 103 monitors sound from the ambient sound microphone(s) 101/102 and determines when user voice activity is detected. The processor 103 performs voice activity detection (VAD) to analyze voice characteristics and properties and distinguish between the user's spoken voice and environmental ambient sounds. As an example, the VAD can evaluate sound level, vocal pitch, resonance characteristics, sound-to-silence gap analysis, signal to noise ratios, and previously learned speaker characteristics or sound patterns. Note, speaker characteristics or sound patterns can be stored locally or remotely on a remote device such as a server or other device operatively coupled to the processor 103. If at step 252 user voice activity is detected, the gain of the incoming audio signal is decreased at step 253 and the ambient sound pass-through gain is increased at step 254.

When user voice activity ceases, a user voice activity timer is started prior to step 255 at which time a front voice activity detector is invoked. The front voice activity detector practiced by the processor 103 determines if there is voice activity from a second individual "close" to the earphone user and at a determined relative direction to the earphone user in order to assess whether that second individual is speaking and engaged in conversation with the user. In some embodiments, "close" is defined as being within approximately 2 meters, and the determined relative direction is defined as being within approximately plus/minus 45 degrees relative to the direction that the earphone user is facing (see also 157 in FIG. 2C).

If at step 255 front voice activity from the second individual is detected, then the gain of the incoming audio signal is maintained (or decreased) and the ambient sound pass-through gain is maintained (or decreased) at step 256. If however voice activity from a second close individual is NOT detected at step 255, the gain of the ambient sound pass-through gain is decreased at step 258, and the gain of the incoming audio signal is increased at step 259. The method then continues back to step 252 to monitor for user voice activity.

When the user ceases to speak, or if no voice activity is detected, the voice activity timer is referenced to determine if there was any recent user voice activity at step 257. For example, if at step 252, no user voice is detected, then there are two timer scenarios. In the first scenario when user voice activity is not detected and the user voice activity timer is below a determined threshold (in some embodiments this is approximately 10 seconds), then it is determined at 257 that there was recent user voice activity (or pending voice activity) and the method proceeds to step 255. The voice activity threshold can be based on voice characteristics (e.g., spectra, phase, timing, onsets, etc.) in addition to sound pressure level. In the second scenario, when user voice activity is not detected at step 252 but the voice activity timer is above the determined threshold, then recent user voice activity exists at step 257 and the gain of the ambient sound pass-through gain is decreased at step 258, and the gain of the incoming audio signal is increased at step 259. Thereafter, the method then continues back to step 252 to monitor for user voice activity.

Figure 2C:
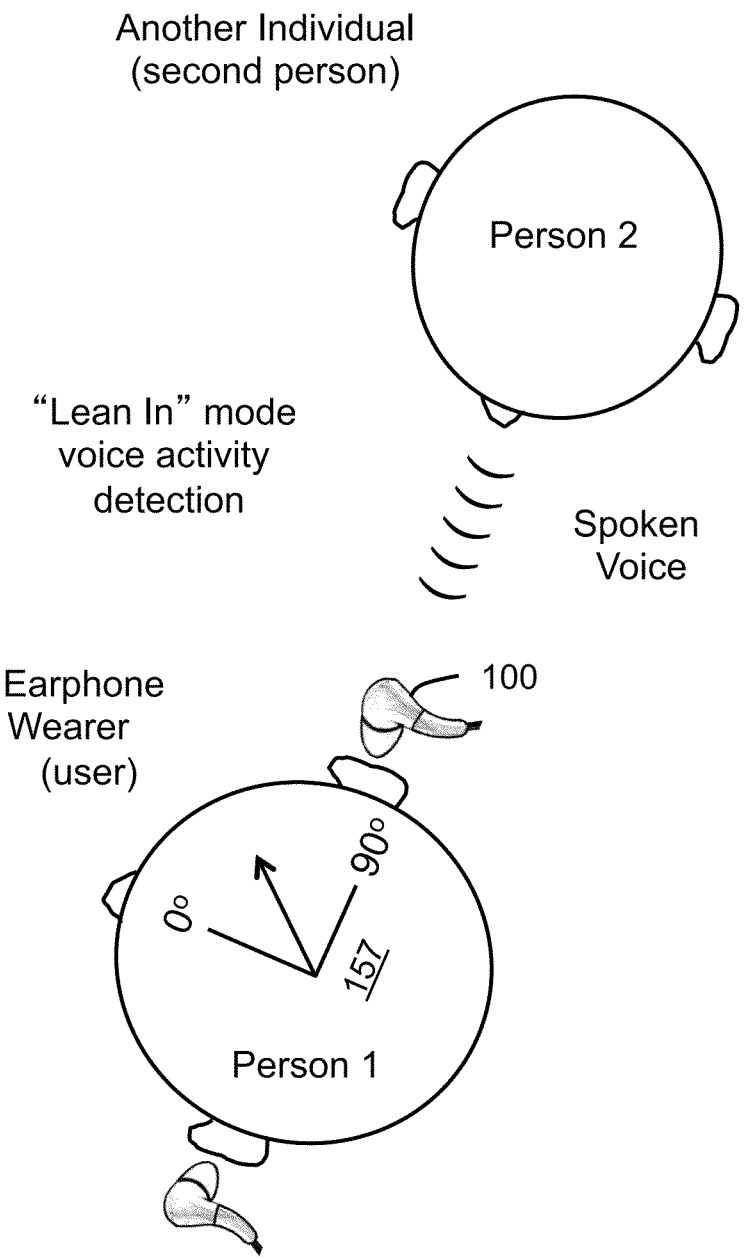
FIG. 2C depicts a user context for "lean in" situation awareness to enable hands-free operation for controlling an ambient sound pass-through in voice conversation with a second individual in close proximity and to one side of a wearer of the earphone in accordance with an exemplary embodiment.

FIG. 2C depicts a user context for "lean in" situation awareness that also practices the steps of method 250 to enable hands-free operation for controlling an ambient sound pass-through in voice conversation with a second individual in close proximity but to a side of a wearer of the earphone in accordance with an exemplary embodiment. As depicted, a user wearing earphones (such as sound isolating earphone or partially occluding earphones) may not be aware that a person to their side, out of visual line of sight, is speaking to them. With "lean in" mode for close proximity detection, the earphones 100, monitor the environment for ambient sounds, and also deliver audio content to the user, analyze the ambient sound signals (and the audio content) to determine if a second individual is to a side and speaking to the user. The earphone 100 can also detect voice activity at greater than 90 degrees from the front of the user; for example, a person directly to the user's side, or slightly behind the user. Moreover, the earphone(s) 100 can be configured differently such that one earphone with respect to the other amplifies sounds greater or less than the other to convey the location of Person 2. As previously noted in FIG. 1B, the gains can further be applied independent of frequency when mixing the ambient sound pass-through and the audio content. For instance, upon detecting side voice activity (see step 255 FIG. 2B), the increasing/decreasing steps can be supplemented with frequency dependent filtering to selectively attenuate/amplify voice characteristics in one earphone with respect to the second earphone. So, for a second individual on the left side speaking to the user, the left earphone 100a will selectively pass-through frequencies of the second individual's voice and attenuate those frequencies from the audible content, whereas the right earphone 100b ambient sound pass-through and audio content is decreased to provide more audible contrast with respect to the combined audio reproduced in the left earphone.

In the context depicted in FIG. 2C, the method 250 for enhancing two-way conversation between a user wearing at least one earphone and a second individual in proximity to the user is implemented by the processor 103 operatively coupled to the earphone. The method 250 includes the steps of detecting a spoken voice of the user from sounds captured at the ambient sound microphone 101/102 communicatively, and automatically activating a voice timer and setting a voice activity threshold for the voice timer responsive to detecting spoken voice. This is achieved by adjusting an ambient sound pass-through of the ambient sound microphone reproduced by an internal speaker of the earphone during activation of the voice timer while a level of the spoken voice is above the voice activity threshold, and/or adjusting a mixing gain (see 185/187) of an audio content signal delivered to the earphone by way of the internal speaker 105 with the ambient sound pass-through during activation of the voice timer.

The earphone 100 by way of the method 250 can detect frontal and/or side voice activity from another individual in proximity to the user, and adjust the mixing gain of the audio content and the ambient sound pass-through of the earphone based on a combined voice activity detection level with combined voice activity time expirations of the user and the second individual. The method 250 as previously described for automatically enhancing situational awareness and improving two-way conversation includes decreasing the audio content signal and increasing the ambient sound pass-through when voice activity of the user is detected, starting a voice activity timer when voice activity ceases, decreasing the ambient sound pass-through and increasing the audio content signal when the frontal voice activity by the another individual is not detected, monitoring the voice activity timer for combined voice activity of the user and the frontal voice activity from the another individual, and maintaining ambient sound pass-through level and audio content signal level during the combined voice activity. The voice activity timer bridges gaps between voice activity of the user and the frontal voice activity of the another individual to a time length that is a function of the combined voice activity.

Further note that additional devices worn by the user or otherwise working cooperatively with the earphones can use their additional microphones to assist in or further refine the lean-in functionality described above to automatically enhance situational awareness and improve multiparty communication. As shown in FIG. 2A, multiple devices (including mobile device 150 and device 160) can provide some relative positional perspective either acoustically or using other location determining devices (such as GPS) to implement appropriate gain modification to one or more of the various microphones from the various devices (100, 150, 160, etc.) based on the direction of the source of the voice activity.

Figure 2D:
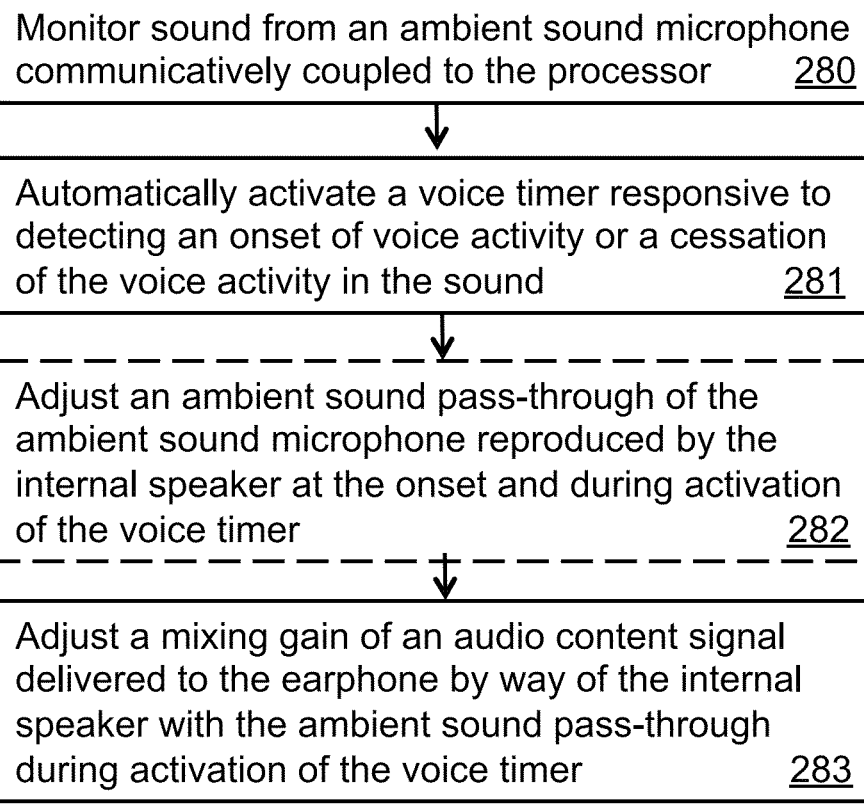
FIG. 2D illustrates a method for controlling an ambient sound pass-through to enhance situation awareness as depicted in FIG. 2A and 2C in accordance with an exemplary embodiment.

FIG. 2D illustrates a method 280 for close proximity detection and audio mixing in accordance with an exemplary embodiment. It is similar in respect to the previously mentioned methods and may be practiced with more or less than the number of steps shown. When describing the method 280, reference may be made to FIGS. 1A-1B and 2A-2C for identifying exemplary components that can implement the method steps herein. Moreover, the method 280 can be practiced by the components presented in the figures herein though is not limited to the components shown.

The method 280 can begin in a state where a user has the earphone 100 on and is listening to music and a second individual initiates conversation with the user. Depictions of which are also shown in FIGS. 2A and 2C. At step 281, the earphone 100 by way of the processor 103 monitors sound from the ambient sound microphone 101 communicatively coupled to the processor 103. At step 282, the method optionally automatically activates a voice timer responsive to detecting voice activity or a cessation of voice activity in the sound. The voice timer activation may exceed a time duration of the voice activity; that is, it surpasses the time length of the voice signal (e.g., a hang over or cliff). At step 283, the processor 103 adjusts an ambient sound pass-through of the ambient sound microphone 101 reproduced by the internal speaker 105 at the onset and during activation of the voice timer. It also adjusts a mixing gain of an audio content signal delivered to the earphone by way of the internal speaker 105 with the ambient sound pass-through during activation of the voice timer at step 284. Aspects of the audio mixing are explained and shown in FIGS. 1B and 2B.

The method 280 by way of the processor 103 also distinguishes between a first spoken voice of a user wearing the earphone and a second spoken voice of another individual in proximity to the user. It determines a direction and proximity of the individual with respect to the user wearing the earphone (See FIGS. 2A and 2C), and adjusts the gain (185/187) of the ambient sound pass-through of the ambient sound microphone 101 as a function of the direction in accordance with the previous methods (see FIGS. 1B and 2B). The second ambient microphone 102 captures ambient sounds, allowing the processor to localize the direction and the proximity of an incoming acoustic sound of the second individual speaking to the user. It thereafter determines the proximity of the individual with respect to the user wearing the earphone 100; and adjusts the gain of the ambient sound pass-through of the ambient sound microphone (one or both 101/102) reproduced by the internal speaker 105 as a function of the direction and proximity The step of adjusting the ambient sound pass-through includes increasing the gain of the ambient sound from the ambient sound microphone delivered by the internal speaker when voice activity is detected above a threshold, and/or decreasing the gain of the ambient sound from the ambient sound microphone delivered by the internal speaker when voice activity is detected below a threshold. The step of adjusting the mixing gain of an audio content signal includes decreasing a volume of the audio content signal delivered to the internal speaker when voice activity is detected above a threshold, and/or increases the volume of the audio content signal delivered to the internal speaker when voice activity is detected below a threshold. In one arrangement, the adjusting of the ambient sound pass-through increases the signal to noise ratio of the ambient sound with respect to background noise.

Figure 3A:
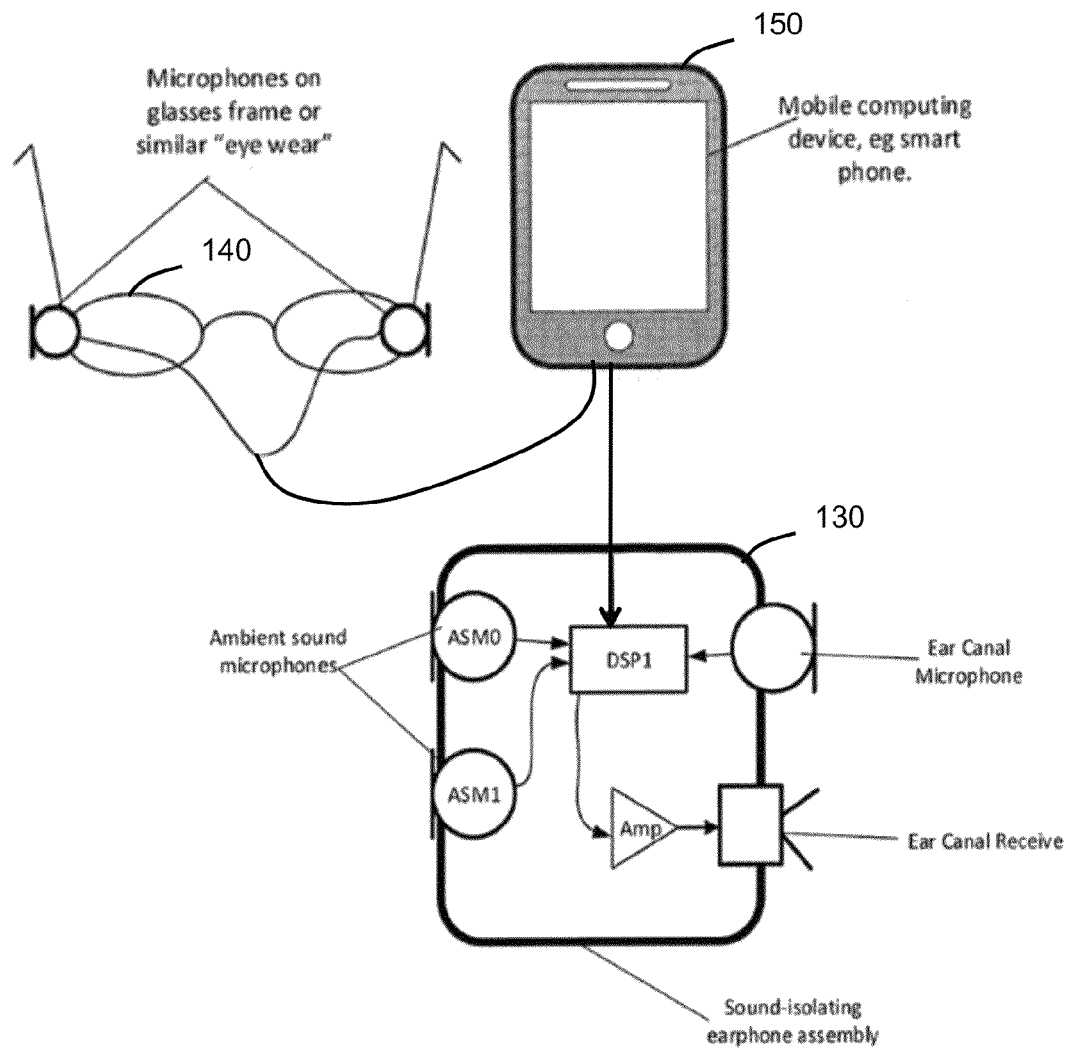
FIG. 3A depicts a system configured for enhancing situation awareness by way of wearable devices, including the earphone of FIG. 1A, in accordance with an exemplary embodiment.

Referring to FIG. 3A, a system 300 for close proximity detection and audio mixing in accordance with an exemplary embodiment is shown. The system 300 includes the earphone 130 (i.e., earphone 100 equipped with an optional ear canal microphone), eyeglasses 140 and a mobile device 150. Notably, more or less than the number of components shown may be connected together at any time. For instance, the eyeglasses 140 and earpiece 130 can be used individually or in conjunction. The system 300 communicatively couples the earphone 130 with the mobile device 150 (voice communication/control; e.g. mobile telephone, radio, computer device) and/or at least one audio content delivery device (e.g. portable media player, computer device) and wearable devices (e.g., eyeglasses 140 and/or earphone 130). The eyeglasses 140 and earphone 130 can also be communicatively coupled to provide audio signal connectivity via a wired or wireless communication link. Additional external microphones may be mounted on the eyeglasses 140, similar to a frame associated with a pair of glasses, e.g., prescription glasses or sunglasses, as shown. As with the microphones in the various devices in FIG. 2A, the additional microphones that can be included on the eyeglasses and the mobile computing device can be used cooperatively to automatically enhance situational awareness and improve multiparty communication.

Figure 3B:
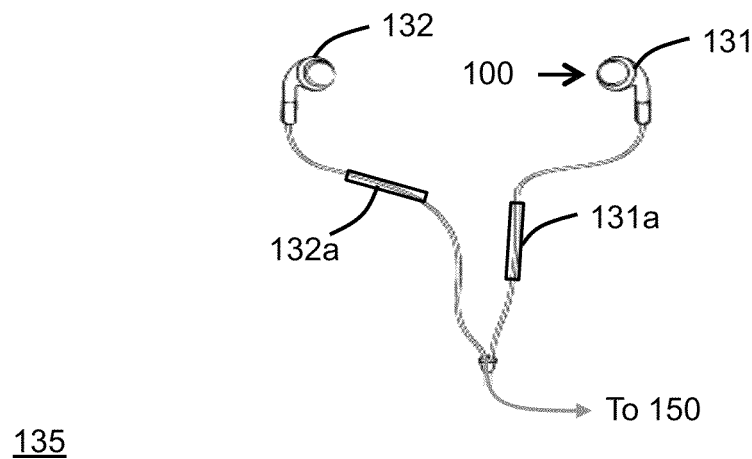
FIG. 3B illustrates a wearable headset comprising one or more earpieces for receiving or providing audio signals in accordance with an exemplary embodiment.

Referring to FIG. 3B, a headset 135 for close proximity detection and audio mixing for use with one or more earpieces 131/132 (each earpiece being similar to earphone 130 of FIG. 3A) as previously discussed is shown in accordance with one embodiment. In this embodiment, a dual earpiece (headset) in conjunction with the mobile device 150 serves as a wearable device arrangement. In some embodiments, the headset 135 can include optional inline microphones 131a and 132a that can be used in the various embodiments herein instead of microphones in the main assembly of the headset or in addition to the microphones in the main assembly of the headset. In some embodiments, the earphone can operate with one or more other external devices. In some embodiments, the headset or earphone 130 having the functionality described herein can be integrated as part of another device. For example, the earphone 130 can be incorporated in a form factor of wired or wireless headsets, earbuds, earpods, music headsets, call center headsets, tactical or military headsets, communication helmets, head-worn or eye-worn game controllers, eyewear (e.g., see FIG. 3C), or fitness or health monitoring devices. In some embodiments the earphones or headsets can be considered a communication system.

Figure 3C:
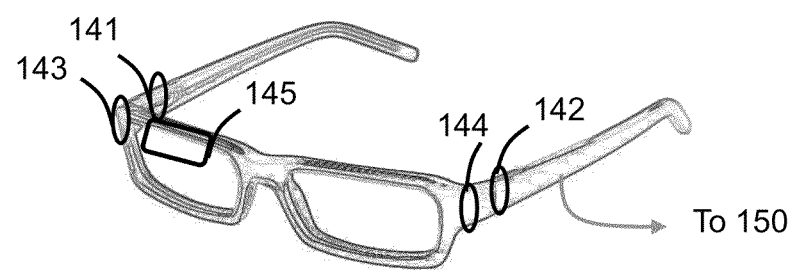
FIG. 3C illustrates wearable eyeglasses comprising one or more sensors for receiving or providing audio signals in accordance with an exemplary embodiment.

Referring to FIG. 3C, the eyeglasses 140 are shown in accordance with another wearable computing device as previously discussed. In this embodiment, eyeglasses 140 operate as the wearable computing device, for collective processing of multiple acoustic signals (e.g., ambient, environmental, voice, etc.) and media (e.g., accessory earpiece connected to eyeglasses for listening) when communicatively coupled to a media device (e.g., mobile device, cell phone, etc., either integrated with the eyeglasses 140 or separate from the eyeglasses 140). In this arrangement, analogous to an earpiece with microphones but rather embedded in eyeglasses, the user may rely on the eyeglasses for voice communication and external sound capture instead of requiring the user to hold the media device in a typical hand-held phone orientation (i.e., cell phone microphone to mouth area, and speaker output to the ears). That is, the eyeglasses sense and pick up the user's voice (and other external sounds) for permitting voice processing. The earpiece 100 may also be attached to the eyeglasses 140 for providing audio and voice, and voice control, as illustrated in the system 300 of FIG. 3A.

In the configuration shown, the first 141 and second 142 microphones are mechanically mounted to one side of eyeglasses to provide audio signal streams. These can serve as ambient sound microphones analogous to those in the earphone 100. Again, the embodiment 140 can be configured for individual sides (left or right) or include an additional pair of microphones on a second side in addition to the first side. The eyeglasses 140 can also include one or more optical elements, for example, cameras 143 and 144 situated at the front or other direction for taking pictures. Similarly, the mobile device 150 (see FIG. 3D) is communicatively coupled to the first microphone 141 and the second microphone 142 to produce the composite signal. (As discussed above, in some embodiments, the mobile device 150 can be integrated as part of the eyeglasses 140). As disclosed in U.S. patent application Ser. No. 13/108,883 entitled "Method and System for Directional Enhancement of Microphone Signals using Small Microphone Arrays", by the same authors, the entire contents of which are hereby incorporated by reference, the audio signals from the first microphone 141 and second microphone 142 are multiplexed and for analysis of a phase angle of the inter-microphone coherence for directional sensitivity, and which allows for directional sound processing and localization.

Figure 3D:
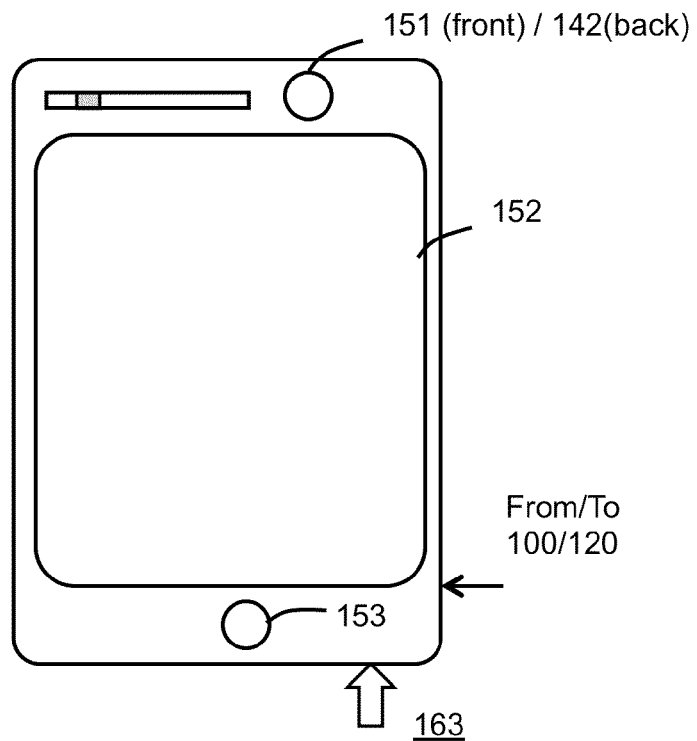
FIG. 3D illustrates a mobile device for coupling with a wearable system in accordance with an exemplary embodiment.

FIG. 3D depicts the mobile device 150 as a media device (i.e., smartphone) which can be communicatively coupled to the audio controller 100 and either or both of the wearable computing devices (100/140). It includes an audio input jack 163 for receiving audio input. The mobile device 150 can include one or more microphones 151 on a front and/or back side, a visual display for providing user input, and an interaction element 153.

Figure 3E:
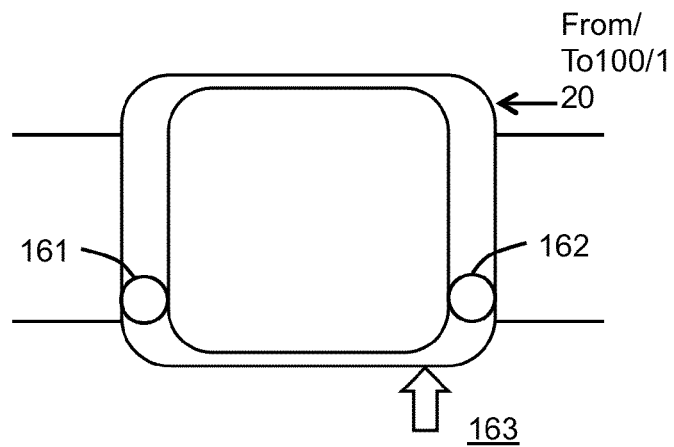
FIG. 3E illustrates a wristwatch for coupling with a wearable system or mobile device in accordance with an exemplary embodiment.

FIG. 3E depicts a second media device 160 as a wristwatch device, which also can be communicatively coupled to the one or more wearable computing devices (100/140). The device 160 can also include one or more microphones 161/162 singly or in an array, for example, beamforming for localization a user's voice or for permitting manual capture of a sound source when the wristwatch is manually oriented in a specific direction. It also includes the audio input jack 163 previously described for receiving audio input.

As previously noted in the description of these previous figures, the processor 103 performing the close proximity detection and audio mixing can be included thereon, for example, within a digital signal processor or other software programmable device within, or coupled to, the media device 150 or 160. As discussed above, components of the media device for implementing multiplexing and de-multiplexing of separate audio signal streams produce a composite signal.

With respect to the previous figures, the system 300 (see FIG. 3A) may represent a single device or a family of devices configured, for example, in a master-slave or master-master arrangement. Thus, components and functionality of the system 300 may be distributed among one or more devices, such as, but not limited to, the media device illustrated in FIG. 3D and the wristwatch in FIG. 3E. That is, the components and functionality of the system 300 may be distributed among several devices (such as a smartphone, a smartwatch, an optical head-mounted display, an earpiece, etc.). Furthermore, the devices (for example, those illustrated in FIG. 3B and FIG. 3C) may be coupled together via any suitable connection, for example, to the media device in FIG. 3D and/or the wristwatch in FIG. 3E, such as, without being limited to, a wired connection, a wireless connection or an optical connection. The examples discussed and shown are merely exemplary and not intended to limit the embodiments represented by the claims.

It should also be noted that the computing devices shown can include any device having audio processing capability for collecting, mining and processing audio signals, or signals within the audio bandwidth (10 Hz to 20 KHz). Computing devices may provide specific functions, such as heart rate monitoring (low-frequency; 10-100 Hz) or pedometer capability (<20 Hz), to name a few. More advanced computing devices may provide multiple and/or more advanced audio processing functions, for instance, to continuously convey heart signals (low-frequency sounds) or other continuous biometric data (sensor signals). As an example, advanced "smart" functions and features similar to those provided on smartphones, smartwatches, optical head-mounted displays or helmet-mounted displays can be included therein. Example functions of computing devices providing audio content may include, without being limited to, capturing images and/or video, displaying images and/or video, presenting audio signals, presenting text messages and/or emails, identifying voice commands from a user, browsing the web, etc. Aspects of voice control included herein are disclosed in U.S. patent application Ser. No. 13/134,222 filed on 19Dec. 2013 entitled "Method and Device for Voice Operated Control", with a common author, the entire contents, and priority reference parent applications, of which are hereby incorporated by reference in entirety.

Figure 4:
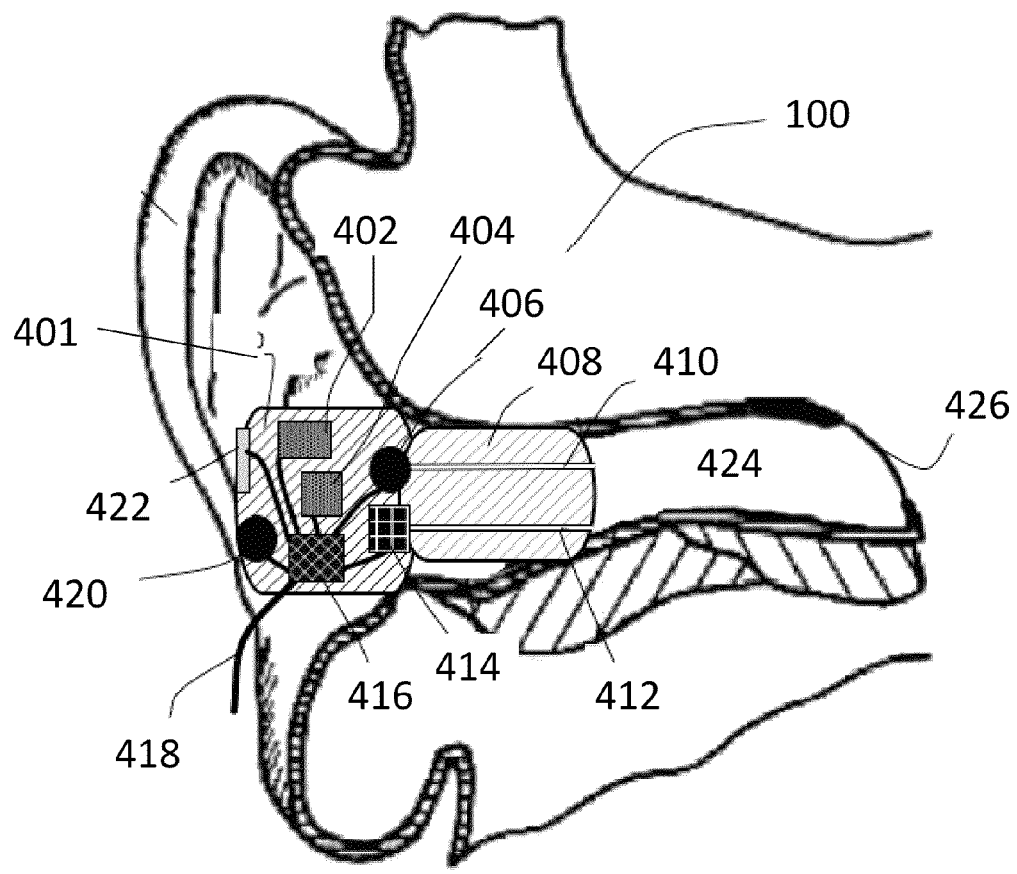
FIG. 4 is an exemplary earpiece for use with the coherence based directional enhancement system of FIG. 1A in accordance with an exemplary embodiment.

FIG. 4 is an exemplary illustration 400 of the earphone 100 with additional components for enabling further features and performing certain inventive aspects herein. The earpiece or earphone 400 contains numerous electronic components, many audio related, each with separate data lines conveying audio data. As illustrated, the earpiece 400 comprises an electronic housing unit 401 and a sealing unit 408. The earpiece depicts an electro-acoustical assembly for an in-the-ear acoustic assembly, as it would typically be placed in an ear canal 424 of a user. The earpiece can be an in the ear earpiece, behind the ear earpiece, receiver in the ear, partial-fit device, or any other suitable earpiece type. The earpiece can partially or fully occlude ear canal 424, and is suitable for use with users having healthy or abnormal auditory functioning.

The earpiece includes an Ambient Sound Microphone (ASM) 420 to capture ambient sound, an Ear Canal Receiver (ECR) 414 to deliver audio to an ear canal 424, and an Ear Canal Microphone (ECM) 406 to capture and assess a sound exposure level within the ear canal 424. The earpiece can partially or fully occlude the ear canal 424 to provide various degrees of acoustic isolation. In at least one exemplary embodiment, assembly is designed to be inserted into the user's ear canal 424, and to form an acoustic seal with the walls of the ear canal 424 at a location between the entrance to the ear canal 424 and the tympanic membrane (or ear drum). In general, such a seal is typically achieved by means of a soft and compliant housing of sealing unit 408. In the embodiments including such a seal, the earphone provides sound isolation from ambient sounds external to an ear canal of the user in which the earphone is inserted and from acoustic sounds internal to the ear canal of the user.

Sealing unit 408 is an acoustic barrier having a first side corresponding to ear canal 424 and a second side corresponding to the ambient environment. In at least one exemplary embodiment, sealing unit 408 includes an ear canal microphone tube 410 and an ear canal receiver tube 414. Sealing unit 408 creates a closed cavity of approximately 5 cc between the first side of sealing unit 408 and the tympanic membrane in ear canal 424. As a result of this sealing, the ECR (speaker) 414 is able to generate a full range bass response when reproducing sounds for the user. This seal also serves to significantly reduce the sound pressure level at the user's eardrum resulting from the sound field at the entrance to the ear canal 424. This seal is also a basis for a sound isolating performance of the electro-acoustic assembly.

In at least one exemplary embodiment and in broader context, the second side of sealing unit 408 corresponds to the earpiece, electronic housing unit 400, and ambient sound microphone 420 that is exposed to the ambient environment. Ambient sound microphone 420 receives ambient sound from the ambient environment around the user.

Electronic housing unit 400 houses system components such as a microprocessor 416, memory 404, battery 402, ECM 406, ASM 420, ECR, 414, and user interface 422. Microprocessor 916 (or processor 416) can be a logic circuit, a digital signal processor, controller, or the like for performing calculations and operations for the earpiece. Microprocessor 416 is operatively coupled to memory 404, ECM 406, ASM 420, ECR 414, and user interface 420. A wire 418 provides an external connection to the earpiece. Battery 402 powers the circuits and transducers of the earpiece. Battery 402 can be a rechargeable or replaceable battery.

In at least one exemplary embodiment, electronic housing unit 400 is adjacent to sealing unit 408. Openings in electronic housing unit 400 receive ECM tube 410 and ECR tube 412 to respectively couple to ECM 406 and ECR 414. ECR tube 412 and ECM tube 410 acoustically couple signals to and from ear canal 424. For example, ECR outputs an acoustic signal through ECR tube 412 and into ear canal 424 where it is received by the tympanic membrane of the user of the earpiece. Conversely, ECM 414 receives an acoustic signal present in ear canal 424 though ECM tube 410. All transducers shown can receive or transmit audio signals to a processor 416 that undertakes audio signal processing and provides a transceiver for audio via the wired (wire 418) or a wireless communication path. Again, this only represents some of the embodiments herein and other embodiments herein do not contemplate sealing of the ear canal, but rather some contemplate partial occlusion or no occlusion.

Figure 5:
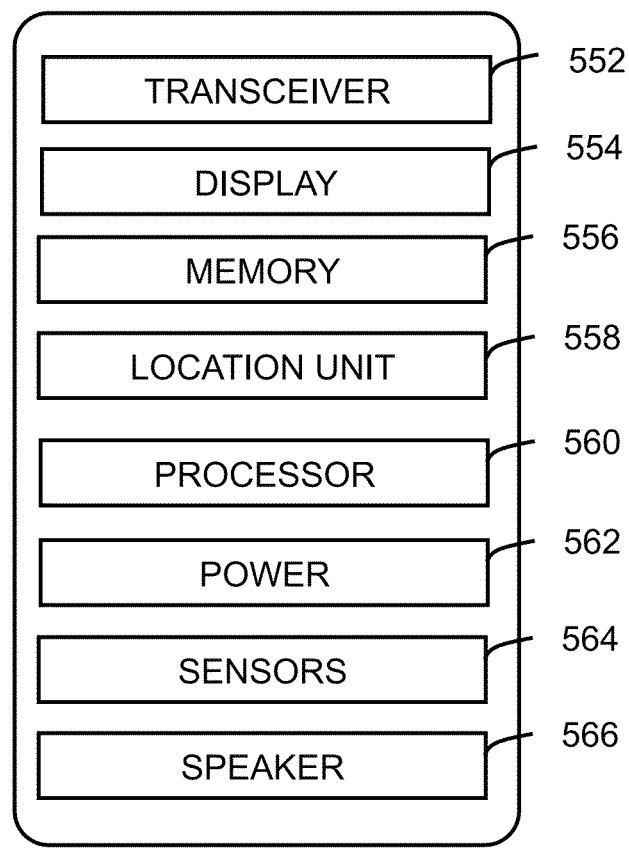
FIG. 5 is an exemplary mobile device for use with the coherence based directional enhancement system in accordance with an exemplary embodiment.

FIG. 5 depicts various components of a multimedia device 500 equipped with processor 103 (see FIG. 1A) suitable for use for use with, and/or practicing the aspects of the inventive elements disclosed herein, for instance method 180 of FIG. 1B and method 250 of FIG. 2B, though is not limited to only those methods or components shown. The components of the device 500 can also be integrated, communicatively coupled, replicated or sourced for use with the devices shown in FIGS. 3A-3E and FIG. 3; that is, all the components, and corresponding operations and features of device 500 can be reproduced therein.

As illustrated, the device 500 comprises a wired and/or wireless transceiver 552, a user interface (UI) display 554, a memory 556, a location unit 558, and a processor 560 for managing operations thereof. The media device 550 can be any intelligent processing platform with Digital signal processing capabilities, application processor, data storage, display, input modality like touch-screen or keypad, microphones, speaker 566, Bluetooth, and connection to the internet via WAN, Wi-Fi, Ethernet or USB. This embodies custom hardware devices, Smartphone, cell phone, mobile device, iPad and iPod like devices, a laptop, a notebook, a tablet, or any other type of portable and mobile communication or computing device. Other devices or systems such as a desktop, automobile electronic dash board, computational monitor, or communications control equipment is also herein contemplated for implementing the methods herein described. A power supply 562 provides energy for electronic components.

In one embodiment where the media device 500 operates in a landline environment, the transceiver 552 can utilize common wire-line access technology to support POTS or VoIP services. In a wireless communications setting, the transceiver 552 can utilize common technologies to support singly or in combination any number of wireless access technologies including without limitation Bluetooth™, Wireless Fidelity (WiFi), Worldwide Interoperability for Microwave Access (WiMAX), Ultra Wide Band (UWB), software defined radio (SDR), and cellular access technologies such as CDMA-1X, W-CDMA/HSDPA, GSM/GPRS, EDGE, TDMA/EDGE, and EVDO. SDR can be utilized for accessing a public or private communication spectrum according to any number of communication protocols that can be dynamically downloaded over-the-air to the communication device. It should be noted also that next generation wireless access technologies can be applied to the present disclosure.

The power supply 562 can utilize common power management technologies such as power from USB, replaceable batteries, supply regulation technologies, and charging system technologies for supplying energy to the components of the communication device and to facilitate portable applications. In stationary applications, the power supply 562 can be modified so as to extract energy from a common wall outlet and thereby supply DC power to the components of the communication device 550.

The location unit 558 can utilize common technology such as a GPS (Global Positioning System) receiver that can intercept satellite signals and there from determine a location fix of the portable device 500. The controller processor 560 can utilize computing technologies such as a microprocessor and/or digital signal processor (DSP) with associated storage memory such a Flash, ROM, RAM, SRAM, DRAM or other like technologies for controlling operations of the aforementioned components of the communication device.

This disclosure is intended to cover any and all adaptations or variations of various embodiments. Combinations of the above embodiments, and other embodiments not specifically described herein, will be apparent to those of skill in the art upon reviewing the above description.

These are but a few examples of embodiments and modifications that can be applied to the present disclosure without departing from the scope of the claims stated below. Accordingly, the reader is directed to the claims section for a fuller understanding of the breadth and scope of the present disclosure.

While the present embodiments have been described with reference to exemplary embodiments, it is to be understood that the possible embodiments are not limited to the disclosed exemplary embodiments. The scope of the following claims is to be accorded the broadest interpretation so as to encompass all modifications, equivalent structures and functions of the relevant exemplary embodiments. Thus, the description of the embodiments is merely exemplary in nature and, thus, variations that do not depart from the gist of the embodiments are intended to be within the scope of the exemplary embodiments of the present invention. Such variations are not to be regarded as a departure from the spirit and scope of the claimed embodiments.

What is claimed is:

1. A method for close proximity detection and automatic audio mixing performed by a processor suitable for use with an earphone, the method comprising the steps of:
   monitoring sound from an ambient sound microphone communicatively coupled to the processor;
   automatically activating a voice timer responsive to detecting voice activity or a cessation of voice activity in the sound as part of the close proximity detection;
   adjusting a mixing gain of an audio content signal delivered to the earphone with the ambient sound pass-through during a voice timer pending voice activity; and
   wherein the audio content is one of a voice signal, music content, or audible sound delivered to the internal speaker for audible reproduction.

2. The method of claim 1, further comprising adjusting an ambient sound pass-through of the ambient sound microphone during the voice timer pending voice activity, wherein the voice timer exceeds a time duration of the voice activity.

3. The method of claim 1, wherein the earphone is configured to provide partial sound isolation.

4. The method of claim 1, wherein the earphone is configured to provide full sound isolation.

5. The method of claim 1, further comprising the steps of:
   detecting between a first voice of a user wearing the earphone and a second voice of another individual in proximity to the user;
   determining a direction and proximity of the individual with respect to the user wearing the earphone; and
   adjusting a gain of the ambient sound pass-through of the ambient sound microphone as a function of the direction.

6. The method of claim 1, further comprising detecting between a first voice of a user wearing the earphone and a second voice of another individual in proximity to the user by evaluating at least one or more of sound level, vocal pitch, resonance characteristics, sound-to-silence gap analysis, signal to noise ratios, and previously learned speaker characteristics or sound patterns.

7. The method of claim 5, further comprising the steps of:
   determining the proximity of the individual with respect to the user wearing the earphone; and
   adjusting the gain of the ambient sound pass-through of the ambient sound microphone as a function of the direction and proximity.

8. The method of claim 5, further comprising the steps of:
   determining the proximity of the individual with respect to the user wearing the earphone; and
   adjusting the beamforming of a plurality of microphones including the ambient sound microphone based on direction and proximity.

9. The method of claim 5, further comprising the steps of:
   determining the proximity of the individual with respect to the user wearing the earphone; and
   adjusting a signal to noise ratio of an ambient sound with respect to background noise and the audio content signal.

10. The method of claim 5, wherein the step of adjusting the ambient sound pass- through comprises:
    increasing a gain of the ambient sound delivered by the ambient sound microphone when voice activity is detected above a threshold; and
    decreasing the gain of the ambient sound delivered by the ambient sound microphone when voice activity is detected below a threshold.

11. The method of claim 10, wherein the threshold comprises sound pressure level and one or more voice characteristics of spectra, phase, timing, or onsets.

12. The method of claim 10, wherein the step of adjusting the mixing gain of an audio content signal comprises:
    decreasing a volume gain of the audio content signal delivered to the earphone when voice activity is detected above a threshold; and
    increasing the volume gain of the audio content signal delivered to the earphone when voice activity is detected below a threshold.

13. The method of claim 1, wherein the audio content is one of a voice signal, music content, or audible sound delivered from a mobile device.

14. The method of claim 1, wherein the adjusting an ambient sound pass-through gain of the ambient sound microphone increases the signal to noise ratio of the ambient sound with respect to background noise and the audio content.

15. The method of claim 5, further comprising detecting an orientation of the ambient microphone location with respect to a leaning of the user in a direction of the individual in proximity to the user, and adjusting the gain of the ambient sound pass-through of the ambient sound microphone as a function of the leaning.

16. The method of claim 5, further comprising enabling a side voice activity detection when the individual is in close proximity within 2 meters and to a left or right side of the user greater than 45 degrees from a front of the user.

17. An communication system for close proximity detection and audio mixing, comprising:
- a first ambient sound microphone;
- an internal speaker for generating audible sounds configured to be directed towards an ear canal; and
- a processor operatively coupled to the communication system, the first ambient sound microphone and the internal speaker, wherein the processor
  - monitors sound from the first ambient sound microphone;
  - automatically activates a voice timer responsive to detecting voice activity or a cessation of voice activity in the sound as part of the close proximity detection;
  - adjusts a mixing gain of an audio content signal delivered to the communciation system by way of the internal speaker with an ambient sound pass-through during the voice timer; and
  - wherein the audio content is one of a voice signal, music content, or audible sound delivered to the internal speaker for audible reproduction.

18. The communication system of claim 17, wherein the processor adjusts an ambient sound pass-through of the ambient sound microphone reproduced by the internal speaker during the voice timer and wherein the voice timer is pending for voice activity and exceeds a time length of the voice activity.

19. The communication system of claim 17, wherein the communication system comprises one or more of a headset, a headphone, an earpiece, a mobile phone, a smart phone, a watch, a personal music player.

20. The communication system of claim 17, wherein the processor:
- distinguishes between a first voice of a user wearing the earphone and a second voice of another individual in proximity to the user;
- determines a direction and proximity of the individual with respect to the user wearing the earphone; and
- adjusts a gain of the ambient sound pass-through of the ambient sound microphone as a function of the direction.

21. The communication system of claim 20, further comprising a second ambient microphone to capture ambient sounds, and where the processor localizes the direction and the proximity of an incoming acoustic sound from the individual.

22. The communication system of claim 20, wherein the processor:
- determines the proximity of the individual with respect to the user wearing the earphone; and
- adjusts the gain of the ambient sound pass-through of the ambient sound microphone reproduced by the internal speaker as a function of the direction and proximity.

23. The communication system of claim 20, wherein the step of adjusting the ambient sound pass-through comprises:
- increases a gain of the ambient sound from the ambient sound microphone delivered by the internal speaker when voice activity is detected above a threshold; and
- decreases the gain of the ambient sound from the ambient sound microphone delivered by the internal speaker when voice activity is detected below a threshold.

24. The communication system of claim 23, wherein the step of adjusting the mixing gain of an audio content signal comprises:
- decreases a volume of the audio content signal delivered to the internal speaker when voice activity is detected above a threshold; and
- increases the volume of the audio content signal delivered to the internal speaker when voice activity is detected below a threshold.

25. The communication system of claim 17, wherein the audio content is one of a voice signal, music content, or audible sound delivered from a mobile device to the internal speaker for audible reproduction.

26. The communication system of claim 17, wherein the adjusting an ambient sound pass-through of the ambient sound microphone increases the signal to noise ratio of the ambient sound with respect to background noise.

27. The communication system of claim 17, wherein the communication system provides sound isolation from ambient sounds external to an ear canal of the user in which the communication system is inserted and from acoustic sounds internal to the ear canal of the user.

28. A method for enhancing two-way conversation, the method implemented by a processor operatively coupled to an earphone comprising the steps of:
- detecting a spoken voice from sounds captured at an ambient sound microphone communicatively coupled to the earphone;
- automatically activating a voice timer and setting a voice activity threshold for the voice timer responsive to detecting spoken voice as part of a close proximity detection;
- adjusting an ambient sound pass-through of the ambient sound microphone reproduced by an internal speaker of the earphone during activation of the voice timer while a level of the spoken voice is above the voice activity threshold; and
- adjusting a mixing gain of an audio content signal delivered to the earphone by way of the internal speaker with the ambient sound pass-through during activation of the voice timer and the close proximity detection,
- wherein the earphone is configured to provide sound isolation from ambient sounds external to an ear canal in which the earphone is inserted and from acoustic sounds internal to the ear canal,
- wherein the audio content is one of a voice signal, music content, or audible sound delivered from a mobile device to the internal speaker for audible reproduction.

29. The method of claim 28, further comprising detecting frontal voice activity from another individual in proximity to the earphone, and adjusting the mixing gain of the audio content and the ambient sound pass-through of the earphone based on a combined voice activity detection level with combined voice activity time expirations of the detected spoken voice and the detected frontal voice activity from another individual.

30. The method of claim 29, further comprising:
- decreasing the audio content signal and increasing the ambient sound pass-through when voice activity is detected;
- starting a voice activity timer when voice activity ceases;
- decreasing the ambient sound pass-through and increasing the audio content signal when the frontal voice activity by the another individual is not detected
- monitoring the voice activity timer for combined voice activity of the detected spoken voice and the frontal voice activity from the another individual; and
- maintaining ambient sound pass-through level and audio content signal level during the combined voice activity,
- wherein the voice activity timer bridges gaps between voice activity of the detected spoken voice and the frontal voice activity of the another individual to a time length that is a function of the combined voice activity.

* * * * *